United States Patent [19]
Ackermann

[11] Patent Number: 5,103,647
[45] Date of Patent: Apr. 14, 1992

[54] DYNAMICALLY BALANCED GIFFORD-MCMAHON REFRIGERATOR COLD HEAD

[75] Inventor: Robert A. Ackermann, Schenectady, N.Y.

[73] Assignee: General Electric Company, Schenectady, N.Y.

[21] Appl. No.: 657,228

[22] Filed: Feb. 19, 1991

[51] Int. Cl.⁵ .............................. F25B 9/00
[52] U.S. Cl. .......................... 62/6; 60/520
[58] Field of Search ................ 62/6; 60/520

[56] References Cited

U.S. PATENT DOCUMENTS

| | | | |
|---|---|---|---|
| 4,143,520 | 3/1979 | Zimmerman | 62/6 |
| 4,277,947 | 7/1981 | Durenec | 62/6 |
| 4,277,948 | 7/1981 | Horn et al. | 62/6 |
| 4,366,676 | 1/1983 | Wheatley et al. | 62/6 |
| 4,397,156 | 8/1983 | Heisig et al. | 62/6 |
| 4,430,863 | 2/1984 | Longsworth | 62/6 |
| 4,922,722 | 5/1990 | Kazumoto et al. | 62/6 |

Primary Examiner—Ronald C. Capossela
Attorney, Agent, or Firm—James R. McDaniel; James C. Davis, Jr.; Paul R. Webb, II

[57] ABSTRACT

A Gifford-McMahon cryorefrigerator is modified by using opposed sub-displacers which are sinusoidally reciprocated in opposite directions with respect to one another such that the force vectors of inertia created by the movement of the sub-displacers are cancelled out. The cancelling out of the force vectors should substantially reduce adverse affects associated with displacer banging.

16 Claims, 3 Drawing Sheets

DYNAMICALLY BALANCED GIFFORD-MCMAHON REFRIGERATOR COLD HEAD

BACKGROUND OF THE INVENTION

This invention relates to Gifford-McMahon, hereinafter referred to as G-M, refrigerator cold heads of the type that have sub-displacer assemblies which are dynamically balanced. Such structures of this type generally eliminate substantially all of the noise and vibration in the cold head by reciprocating the sub-displacers in opposing sinusoidal motions so that the inertias of the sub-displacers due to the opposing, sinusoidal motion should cancel each other out. In particular, a G-M cold head is constructed of at least two sub-displacers, having springs located on both ends of the sub-displacers, such that the sub-displacers are sinusoidally driven by a pressure drive and the sinusoidal movement of the sub-displacers should cause the inertia of the sub-displacers created by the sinusoidal movement to be cancelled which, in turn, should substantially eliminate noise and vibration in the cold head. This invention relates to certain unique G-M cold head assemblies and the noise and vibration reduction means in associations therewith.

Typically, the G-M cold head is used in magnetic resonant imaging devices. Any type of extraneous vibration or noise adversely affects the quality of the images produced by the devices such that "ghosts" or "artifacts" can be created in the images if undue vibrations are experienced in the device.

In view of this, it is known, in prior G-M cold head systems, to make use of a cold head system including a displacer drive system to cool the coils in an imaging device. In each of these cases, the inertia of the displacer was not controlled which resulted in "displacer banging" which, in turn, could create ghosts or artifacts in the images.

Exemplary of such prior art G-M cold head systems are the undirectional mechanical mechanism and the pneumatic displacer drive mechanism. The unidirectional mechanical mechanism, typically, employs a conventional Scotch-yoke mechanical drive mechanism to drive the first and second stage displacers. This well-known Scotch-yoke drive mechanism is inherently noisy and could create undue vibrations which may adversely affect the quality of the images produced. Also, the individual mechanical mechanism employs a second stage low temperature seal which should separate the gases between the first and second stage displacers, which are maintained at temperatures of 50 K. in the first stage and 10 K. in the second stage. However, the seal, typically, wears out after a relatively short period of time and the gases, at those different temperatures, could begin to mix which may adversely affect the mechanism by creating an undue heat load upon the mechanical mechanism.

With respect to the pneumatic displacer drive mechanism, typically, the drive mechanism has at least three separate cavities having a particular volume associated with that particular cavity. The displacer is driven by a pressure/force imbalance created between the cavities. While this device is relatively simple in its construction, there is relatively no means provided for dampening the displacer, thus displacer banging could be relatively acute in this device. In view of the prior art as set forth above, a more advantageous system, then, would be presented is such amounts of noise, vibration and seals were reduced.

It is apparent from the above that there exists a need in the art for a G-M cold head system which adequately cools the coils in the superconductive magnet of an imaging device, and which at least equals the cooling efficiency of known G-M cold heads, but which at the same time substantially reduces the noise and vibration associated with displacer banging or the like. It is a purpose of this invention to fulfill this and other needs in the art in a manner more apparent to the skilled artisan once given the following disclosure.

SUMMARY OF THE INVENTION

Generally speaking, the invention fulfills these needs by providing an improved cold head for a Gifford-McMahon cryorefrigerator, comprising a first thermal station, a second thermal station located substantially adjacent said first thermal station, a first thermal regenerator, a second thermal regenerator located substantially adjacent said first regenerator, the improvement comprising, a drive means, and at least one displacer means having at least two separate sub-displacer means which are driven by said drive means in a substantially sinusoidal motion to produce an inertial vector force for each said sub-displacer means such that the sum of said inertial force vectors of each said sub-displacer means is substantially completely eliminated.

In certain preferred embodiments, the first thermal station and the second thermal station substantially contact the superconductor coil and the thermal shield, respectively. Also, the sub-displacers substantially contact the thermal regenerators. Finally, the sub-displacers are spring loaded and are driven by a periodical pressure drive.

In another further preferred embodiment, all of the noise and vibration due to, among other phenomena, displacer banging, should be substantially dampened out.

In particularly preferred embodiments, the cold heads of this invention consists essentially of two dynamically opposed sub-displacers which are reciprocated by a pressurized, periodical drive mechanism such that the coils and thermal shield of a superconductive magnet are cooled to at least 10 K. and 50 K., respectively, and the sub-displacers are reciprocated such that the inertial force vectors acting along the direction of movement of these sub-displacers cancel each other out in order to substantially dampen out the noise and vibration in the cold head.

The preferred G-M cold head, according to this present invention, offers the following advantages: easy assembly and repair; excellent cooling performance; good stability; good durability; excellent noise/vibration dampening; good economy; and high strength for safety. In fact, in many of the preferred embodiments, these factors of cooling performance and noise/vibration dampening are optimized to an extent considerably higher than heretofore achieved in prior, known G-M cold heads.

BRIEF DESCRIPTION OF THE DRAWINGS

This invention will now be described with respect to certain embodiments thereof as illustrated in the accompanying drawings where.

DETAILED DESCRIPTION OF THE INVENTION

Figure 1:
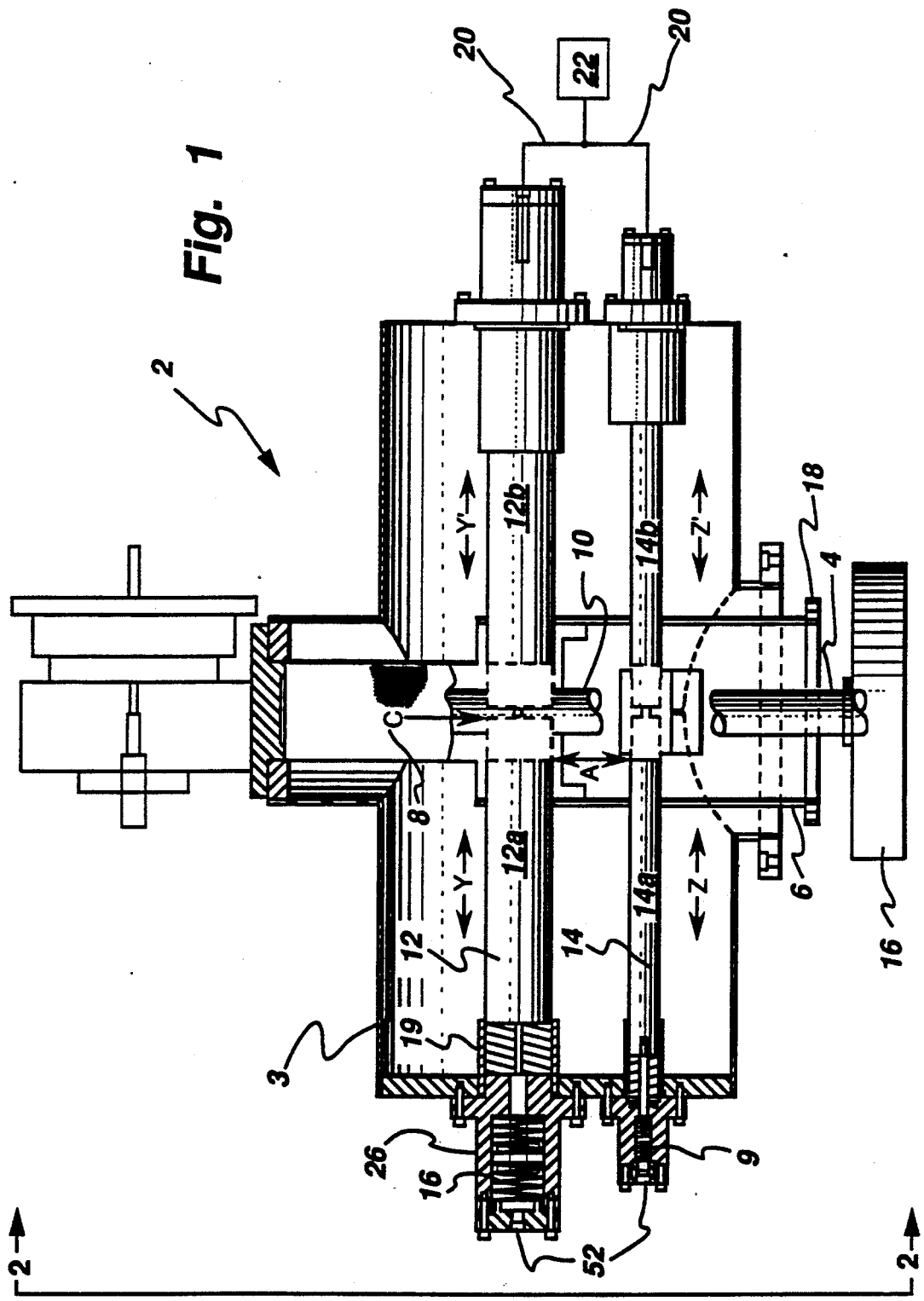
FIG. 1 is a side plan view of a G-M cold head, according to the present invention.
Figure 2:
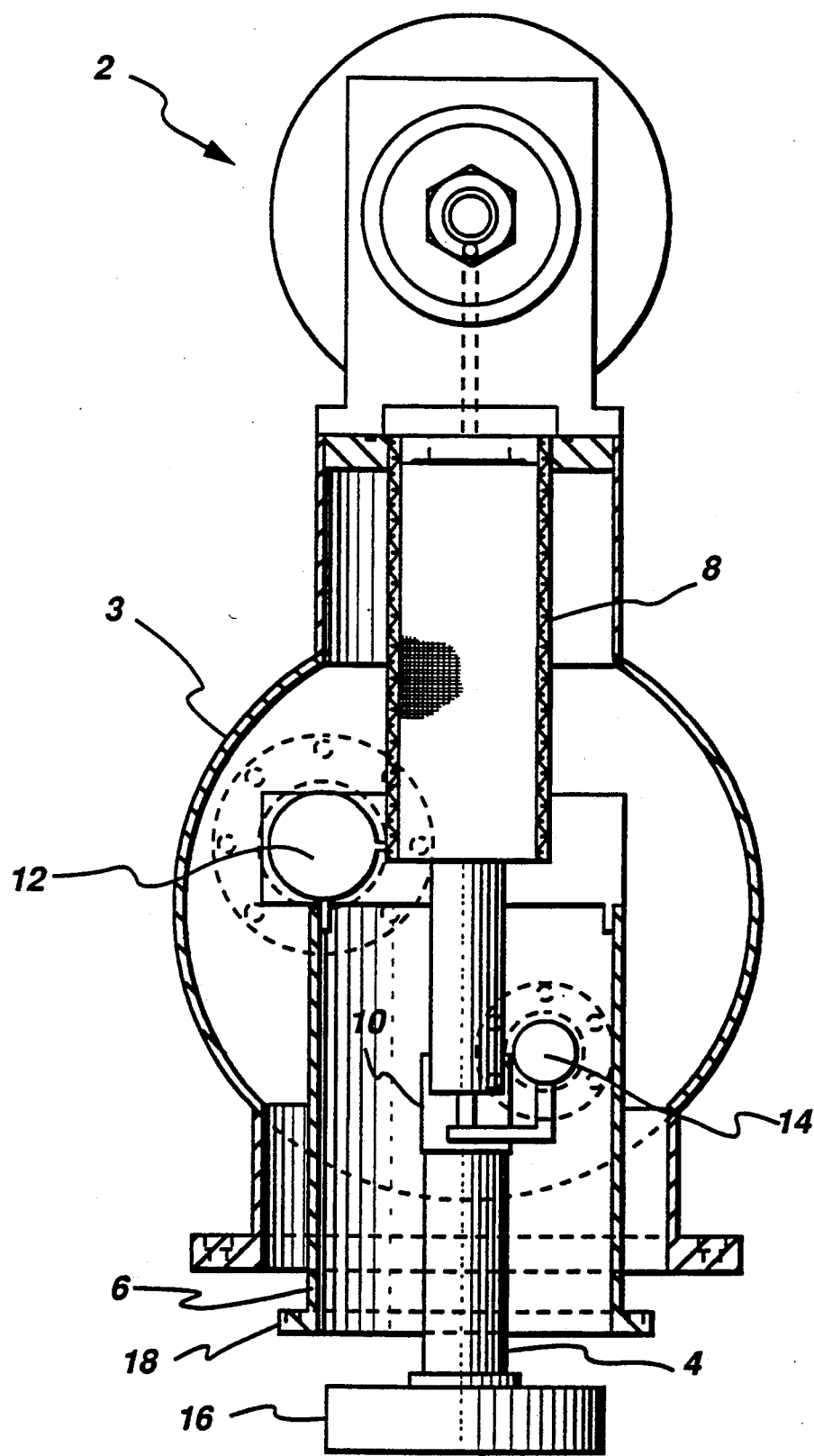
FIG. 2 is an end view of a G-M cold head, according to the present invention.

With reference first to FIGS. 1 and 2, there is illustrated a G-M cold head 2 having a housing 3, preferably, constructed of non-magnetic stainless steel. Cold head 2 consists of first stage and second stage thermal stations 6,4, first stage and second stage thermal regenerators 8,10 and first and second stage opposed sub-displacers 12,14.

In particular, one end of a conventional second stage thermal station 4 contacts coils 16 of a superconductive magnet (not shown). Preferably, thermal station 4 maintains the temperature of coils 16 at around 10 K. and is constructed of copper. Thermal station 4 is connected at its other end by conventional heat transferring connectors to second stage opposed displacer 14 and second stage thermal regenerator 10. In this manner, substantially any heat absorbed by thermal station 4 is conducted to displacer 14 and thermal regenerator 10 where the heat is then dissipated. Displacer 14, as well as displacer 12, is, preferably, constructed of a conventional glass, epoxy composition. Thermal regenerator 10, preferably, is constructed of packed lead spheres, typically, having a diameter of 0.009 inches while thermal generator 8 is, preferably, constructed of a bronze wire screen, typically, having a 200 mesh size.

Typically, located above coil 16 is a conventional thermal shield 18. Shield 18 is rigidly attached to the superconductive magnet (not shown) by a conventional attaching means and is, usually, spaced a predetermined distance away from coils 16. One end of conventional first stage thermal station 6 contacts shield 18 so as to provide cooling at approximately 50 K. for shield 18. The other end of thermal station 6 is connected by conventional, heat transferring connections (not shown) to first stage opposed displacer 12 and first stage thermal regenerator 8. In this way, heat from shield 18 should be absorbed by thermal station 6 and substantially transferred to displacer 12 and thermal regenerator 8 where the heat is then dissipated.

Figure 3:
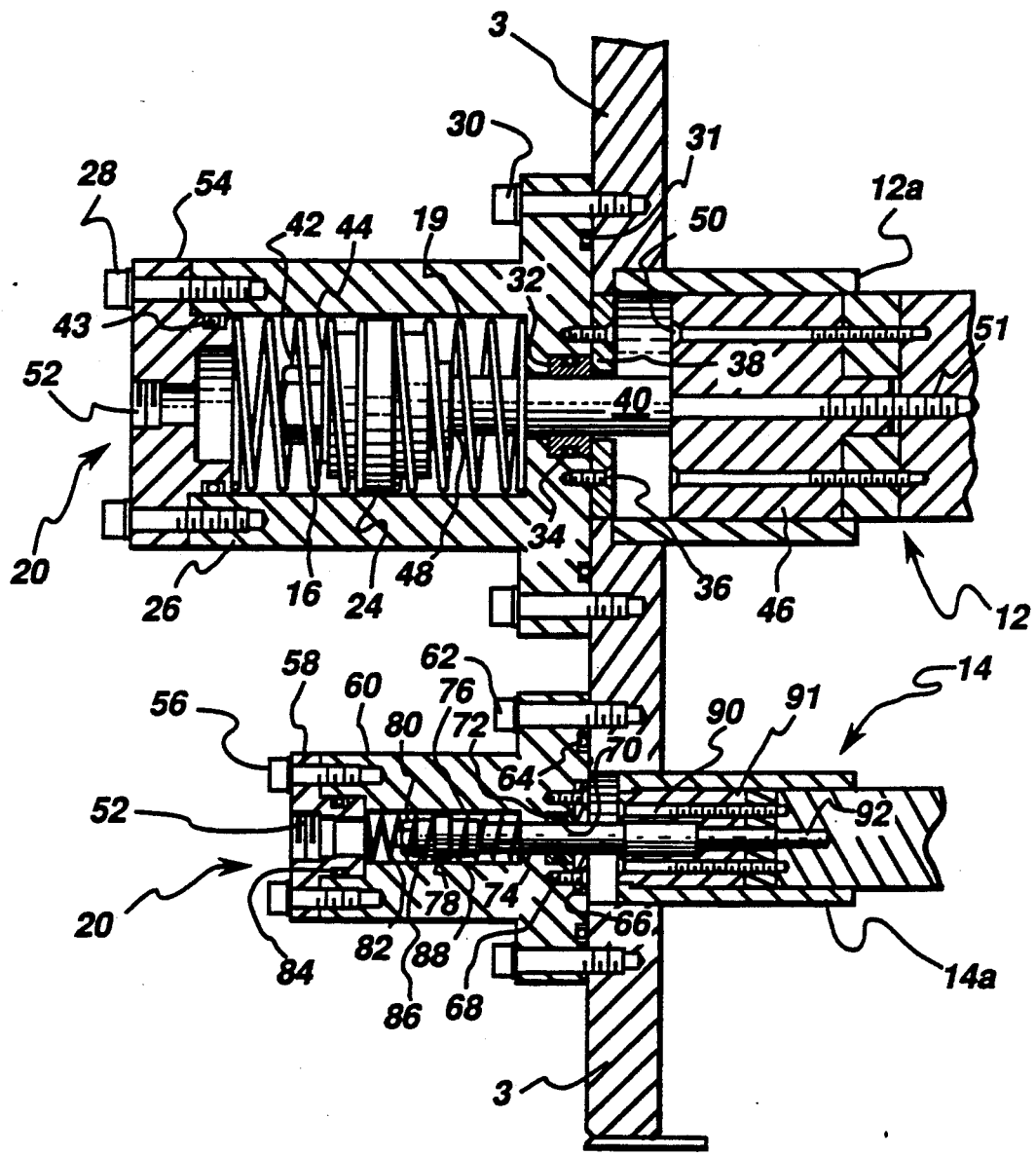
FIG. 3 is an enlarged view of the opposed displacer assembly, according to the present invention.

Displacers 12,14 are reciprocated, preferably, in a periodical, sinusoidal, motion (arrows Y,Y'Z,Z', respectively, in FIG. 3) by a gas inlet drive mechanism 20. Drive mechanism 20 is connected by conventional pressure connections 52 to inlet adapter 58 (FIG. 3). The other end of drive mechanism 20 is connected to a conventional cryocooler compressor 22. Compressor 22 should be of such a construction that it can deliver to displacer 12,14, a mass flow rate, preferably, of approximately 3.5 gm/S over a periodical pressure range, preferably, of 100–300 psi. With respect to FIG. 3, the details of the displacers 12,14 can be more clearly seen. It should be understood that while only one side of displacers 12,14 will be described, namely, the sides related so sub-displacers 12a,14a, the other sides of displacers 12,14, namely, sub-displacers 12b,14b are constructed in substantially the same manner.

First stage opposed sub-displacer 12a contacts first stage thermal regenerator 8. As mentioned earlier, gas inlet drive 20 is threadly attached by conventional threads 52 to inlet adapter 54. Adapter 54, preferably, is constructed of non-magnetic stainless steel. Adapter 54 is rigidly attached to by conventional fasteners 28 to spring holder 26. A conventional elastomeric O-ring 43 is located adjacent to spring 16 to substantially prevent any gas which may have leaked into the area around spring 16 from being released from the cold head 2. Spring holder 26 is rigidly attached by conventional fasteners 30 to housing 3. A conventional elastomeric O-ring 31 is located within holder 26 and, preferably, abuts up against housing 3 to substantially prevent gases from leaking out of housing 3 and into spring holder 26.

Dampening pads 38, preferably, constructed of a conventional force dampening material, are rigidly attached by conventional fasteners 36 to holder 26. Pads 38 should be constructed such that they should dampen substantially all of the forces created if displacer 12 contacts pads 38.

Guide 32, having a conventional elastomeric O-ring 34, is, preferably, constructed of a conventional polymeric material. Guide 32 should act as a guide surface for extension rod 40 as sub-displacer 12a reciprocates. O-ring 34 should substantially prevent gases from leaking into the area where springs 16 and 19 are located. A conventional spring 19 is located so that it abuts against holder 26 and retainer 24. Spring 19, preferably, has a spring constant of 10 pounds/in. and is constructed of non-magnetic, stainless steel. Also, retainer 24 is, preferably, constructed of non-magnetic stainless steel. Retainer 24 is rigidly secured to extension rod 40 by abutment 48, conventional washer 44 and conventional fastener 42. Abutment 48 is, preferably, preformed on extension rod 40. Spring 16 is located between retainer 24 and inlet adapter 54. Spring 16, preferably, has a spring constant of 10 pounds/in. and is constructed of non-magnetic, stainless steel. The other end of extension rod 40 is rigidly secured in sub-displacer 12a by conventional fasteners 51. Sub-displacer extension 46 is rigidly attached to sub-displacer 12 by conventional fasteners 50. Extension 46 is, preferably, constructed of non-magnetic stainless steel. Second stage opposed sub-displacer 14a contacts second stage thermal regenerator 10 along its length. Inlet adapter 58, preferably, constructed of non-magnetic, stainless steel, and having a conventional threaded connection 52, is rigidly attached to spring holder 60. Gas inlet drive 20 is connected to adapter 58 through connection 52.

Spring holder 60 is preferably, constructed of non-magnetic, stainless steel and is rigidly connected to housing 3 by conventional fasteners 62. Spring holder 60 includes conventional elastomeric O-rings 64 and 84. O-rings 64 and 84 are provided so as to substantially reduce the likelihood of gas leaking from cold head 2.

Dampening pads 66, preferably, constructed of a conventional elastomeric material, are rigidly secured to spring holder 60 by conventional fasteners 68. Pads 66 should dampen out the forces created if sub-displacer 14a contacts pads 66 and should be constructed much like pads 38.

Guide 72, having a conventional O-ring 70, is preferably, constructed of a conventional polymeric material. Guide 72, like guide 32, should act as a guide surface for extension rod 74 as sub-displacer 14a reciprocates. O-ring 70 should substantially prevent gases from leaking into the area where springs 76 and 82 are located. A conventional spring 76 is located so that it abuts against holder 60 and retainer 78. Spring 76, preferably, has a spring constant of 2 pounds/in. and is constructed of non-magnetic stainless steel. Also, retainer 78 is, preferably, constructed of non-magnetic stainless steel. Retainer 78 is rigidly secured to extension rod 74 by abutment 88, conventional washer 86 and conventional fastener 80. Abutment 88 is, preferably, preformed on extension rod 74. Spring 82 is located between retainer 78 and inlet adapter 58. Spring 82, preferably, has a spring constant of 2 pounds/in. and is constructed of non-magnetic, stainless steel. The other end of extension rod 74 is rigidly secured in sub-displacer 14a by conventional fastener 92. Sub-displacer extension 91 is rigidly attached to sub-displacer 14a by conventional fasteners 90. Extension 91 is, preferably, constructed of non-magnetic, stainless steel.

In operation, thermal station 4 contacts coils 16 to substantially maintain coils 16 at a temperature of approximately 10 K. Also, thermal station 6 contacts thermal shield 18 to substantially maintain shield 18 at a temperature of approximately 50 K. This construction is well known and conventional.

If coils 16 and/or shield 18 experience any heat gain, for example, due to quenching of coils 16, then this heat should be transferred to thermal stations 4,6, where this heat is ultimately transferred to thermal regenerators 10 and 8, respectively.

In particular, after heat is transferred to thermal station 4, this heat is, preferably, transferred to thermal regenerator 10. Heat is dissipated by displacer 14 into thermal regenerator 10 through the use of gas inlet drive 20 and springs 76 and 82 which create varying pressures and volumes between sub-displacers 14a and 14b. These varying pressures and volumes create a conventional refrigeration cycle which allows the heat to be dissipated.

Each displacer 14, preferably, contains two separate sub-displacers 14a, 14b which reciprocate along arrows Z and Z', respectively, in opposite directions from one another. Sub-displacers 14a,14b are reciprocated in opposite directions by drive 20 and compressor 22.

Compressor 22 should be of such a type that it is capable of reciprocating sub-displacers 14a,14b, in a periodically, sinusoidally opposed directions Z and Z', respectively, such that the sum of the force vectors of the inertia of sub-displacers 14a, 14b generated by the opposed motion and acting along directions Z and Z', respectively, are substantially cancelled out which should substantially eliminate noise and vibration in cold head 2.

Compressor 22, preferably, operates over a periodical range of 100 to 300 psi. In particular, when compressor 22 is operating at 100 psi, springs 76,82 maintain sub-displacers 14a,14b near point A in FIG. 3 and sub-displacers 14a,14b are spaced at a distance away from one another. This spacing provides a large volume and a small pressure near regenerator 8.

When compressor 22 periodically increases its pressure to 300 psi, this pressure overcomes the compression in force springs 16,19 and causes sub-displacers 14a,14b to move closer together until they approach point C. This spacing, conversely, provides a small volume and a high pressure near regenerator 8.

The reciprocating of sub-displacers 14a,14b and the associated changes in pressures and volumes in the space between sub-displacers 14a,14b should cause heat to be dissipated from sub-displacers 14a,14b into regenerator 8 by well-known refrigeration techniques, which, in turn, causes coils 16 to be cooled.

With respect to thermal station 8, after heat is transferred to thermal station 6, this heat is, preferably, transferred to displacer 12, where displacer 12 dissipates the heat into thermal regenerator 8. Heat is dissipated by displacer 12 into thermal regenerator 8 through the use of gas inlet device 20 and springs 16 and 19 which create varying pressures and volumes between sub-displacers 12a and 12b. These varying pressures and volumes create a well-known refrigeration cycle which allows the heat to be dissipated.

Each displacer 12 preferably contains two separate sub-displacers 12a,12b which reciprocate along arrows Y and Y', respectively, in opposite directions from one another. Sub-displacers 12a,12b are reciprocated in opposite directions by drive 20 and compressor 22 the same as sub-displacers 14a,14b.

Compressor 22 should be of such type that it is capable of reciprocating subdisplacers 12a,12b in a periodical, sinusoidally opposed directions Y and Y', respectively, such that the sum of the force vectors of the inertia of sub-displacers 12a,12b generated by the opposed motion and acting along directions Y and Y', respectively, are substantially cancelled out which should, in turn, substantially eliminate noise and vibration in cold head 2.

When compressor 22 is operating at 100 psi, springs 16,19 maintain sub-displacers 12a,12b near point A in FIG. 3 and sub-displacers 12a,12b are spaced at a distance away from one another. This spacing provides a large volume and a small pressure near regenerator 10.

When compressor 22 periodically increases its pressure to 300 psi, this pressure overcomes the compression in force springs 16,19 and causes sub-displacers 12a,12b to move closer together until they approach point C. This spacing, conversely, provides a small volume and a high pressure near regenerator 10.

The reciprocating of sub-displacers 12a,12b and the associated changes in pressures and volumes in the space between sub-displacers 12a,12b should cause heat to be dissipated from sub-displacers 12a,12b into regenerator 10, by well-known refrigeration techniques which, in turn, causes shield 18 to be cooled.

Once given the above disclosure, many other features, modifications and improvements will become apparent to the skilled artisan. Such features, modifications and improvements are, therefore, considered to be a part of this invention, the scope of which is to be determined by the following claims.

What is claimed is:

1. An improved cold head for a Gifford-McMahon cryorefrigerator which is comprised of:
    a first thermal station;
    a second thermal station located substantially adjacent said first thermal station;
    a first thermal regenerator;
    a second thermal regenerator located substantially adjacent said first regenerator;
    the improvement comprising
      a drive means; and
      at least one displacer means having at least two separate sub-displacer means which are driven by said drive means in a substantially sinusoidal motion to produce an inertial force vector for each said sub-displacer means such that the sum said that inertial force vectors of each said sub-displacer means is substantially completely eliminated.

2. The cold head for a Gifford-McMahon cryorefrigerator, according to claim 1, wherein said first thermal station substantially contacts a thermal shield on a superconductive magnet.

3. The cold head for a Gifford-McMahon cryorefrigerator, according to claim 1, wherein said second thermal station substantially contacts coils on a superconductive magnet.

4. The cold head for a Gifford-McMahon cryorefrigerator, according to claim 1, wherein said first thermal regenerator is further comprised of:
   a bronze wire screen means having a mesh size of approximately 200.

5. The cold head for a Gifford-McMahon cryorefrigerator, according to claim 1, wherein said second thermal regenerator is further comprised of:
   a packed lead sphere means having a sphere means diameter of approximately 0.009 inches.

6. The cold head for a Gifford-McMahon cryorefrigerator, according to claim 1, wherein said first thermal station substantially contacts said first thermal regenerator.

7. The cold head for a Gifford-McMahon cyorefrigerator, according to claim 1, wherein said second thermal station substantially contacts said second thermal regenerator.

8. The cold head for a Gifford-McMahon cryorefrigerator, according to claim 1, wherein said drive means is further comprised of:
   a sinusoidal gas compressor means; and
   a connection means between said compressor means and said displacer means.

9. The cold head for a Gifford-McMahon cryorefrigerator, according to claim 7, wherein said compressor means operates over a pressure range of approximately 100 to 300 psi.

10. The cold head for a Gifford-McMahon cryorefrigerator, according to claim 1, wherein said displacer means are constructed of a glass epoxy composition.

11. The cold head for a Gifford-McMahon cryorefrigerator, according to claim 1, wherein said first and second thermal stations are constructed of copper.

12. The cold head for a Gifford-McMahon cryorefrigerator, according to claim 1, wherein said drive means is further comprised of:
   a spring means located substantially on said displacer means; and
   a dampening means located adjacent said displacer means.

13. The cold head for a Gifford-McMahon cryorefrigerator, according to claim 12, wherein said spring means is constructed of non-magnetic stainless steel.

14. The cold head for a Gifford-McMahon cryorefrigerator, according to claim 12, wherein said dampening means is constructed of an elastomeric material.

15. The cold head for a Gifford-McMahon cryorefrigerator, according to claim 12, wherein said displacer means is further comprised of:
   an extension means which contacts said spring means.

16. A Gifford-McMahon cryorefrigeration method for a superconductive magnet having a thermal shield and coils having a cryorefrigerator with a first thermal station, a second thermal station located substantially adjacent said first thermal station, a first thermal regenerator, a second thermal regenerator located substantially adjacent said first thermal regenerator, a drive means, and at least one displacer means having at least two separate sub-displacer means, comprising the steps of:
   contacting said shield with said first thermal station such that heat can be transferred from said shield to said first thermal station;
   contacting said coils with said second thermal station such that heat can be transferred from said coils to said second thermal station;
   contacting said first thermal station with said displacer means so that heat can be transferred from said first thermal station to said displacer means;
   contacting said second thermal station with said displacer means so that heat can be transferred from said second thermal station to said displacer means;
   driving said displacer means in a periodical manner such that said sub-displacers are reciprocated in opposite directions to create varying pressures and volumes between said sub-displacers and force vectors of inertia which should cancel each other out; and
   contacting said displacer means with said first and second thermal regenerators so that heat is transferred from said displacer means into said thermal regenerator so that the heat is dissipated.

* * * * *